(12) United States Patent
Drachev et al.

(10) Patent No.: US 7,452,614 B2
(45) Date of Patent: Nov. 18, 2008

(54) LUMINESCENT SEMI-CONDUCTIVE POLYMER MATERIAL, METHOD OF PREPARING THE SAME AND ORGANIC LIGHT EMITTING ELEMENT HAVING THE SAME

(75) Inventors: Alexandr Ivanovich Drachev, Moscow (RU); Alla Borisovna Gilman, Moscow (RU); Alexandr Alexeevich Kuznetsov, Moscow (RU); Nikolay Mikhaylovich Surin, Troitsk (RU)

(73) Assignee: Samsung Electronics Co., Ltd. (KR)

( * ) Notice: Subject to any disclaimer, the term of this patent is extended or adjusted under 35 U.S.C. 154(b) by 523 days.

(21) Appl. No.: 11/024,608

(22) Filed: Dec. 30, 2004

(65) Prior Publication Data

US 2005/0236604 A1 Oct. 27, 2005

(30) Foreign Application Priority Data

Mar. 17, 2004 (RU) ............................... 2004107865

(51) Int. Cl.
*H01L 51/54* (2006.01)
*H01L 51/50* (2006.01)
*C09K 11/06* (2006.01)
*C08G 83/00* (2006.01)

(52) U.S. Cl. ................. 428/690; 428/917; 313/504; 257/40; 257/E51.027; 257/E51.041; 257/E51.043; 252/301.31; 252/301.35; 427/66; 427/488

(58) Field of Classification Search ................. 428/690, 428/917; 313/502–509; 427/58, 66, 488; 257/40, 88–103, E51.001–E51.052; 252/301.16–301.35
See application file for complete search history.

(56) References Cited

U.S. PATENT DOCUMENTS

| 5,811,833 | A  | * | 9/1998  | Thompson | .................... 257/40 |
|-----------|----|---|---------|----------|---------------------------|
| 6,361,885 | B1 |   | 3/2002  | Chou     |                           |
| 6,495,273 | B1 |   | 12/2002 | Hwang et al. |                       |
| 2003/0082406 | A1 | | 5/2003  | Murase   |                           |

FOREIGN PATENT DOCUMENTS

| EP | 0669387     |    | 8/1995   |
|----|-------------|----|----------|
| JP | 9-082473    |    | 3/1997   |
| JP | 09-289081   | *  | 11/1997  |
| RU | 2155204 C2  |    | 8/2000   |

OTHER PUBLICATIONS

Jones et al., "Energy transfer for laser dyes cobound in organic polymers," Proceedings of SPIE, vol. 2698, pp. 65-74, Mar. 1996.*
Chen et al., "Synthesis of 2,6-diethyl-3-methacroyloxymethyl-1,5,7,8-tetramethylpyrromethene-BF2 for the preparation of new solid-state laser dyes," Heteroatom Chemistry, vol. 8, No. 1, pp. 51-54, 1997.*
Osada et al., "Preparation and electrical properties of polymeric copper phthalocyanine thin films by plasma polymerization," Journal of Applied Physics, vol. 59, No. 5, pp. 1776-1779, Mar. 1986.*
Eufinger et al., "DC plasma-polymerization of pyrrole: Comparison of films formed on anode and cathode," Journal of Applied Polymer Science, vol. 61, No. 9, pp. 1503-1513, Aug. 1996.*
Seoul et al., "Polymer light-emitting devices based on plasma-polymerized benzene and plasma-polymerized naphthalene," Journal of Materials Science: Materials in Electronics, vol. 12, No. 1, 51-55, Jan. 2001.*

* cited by examiner

*Primary Examiner*—Callie Shosho
*Assistant Examiner*—Michael E Nelson
(74) *Attorney, Agent, or Firm*—Jonathan W. Hallman; MacPherson Kwok Chen & Heid LLP

(57) ABSTRACT

The present invention is related to a luminescent material generated by polymerization of a pyrromethene complex by glow discharge. The polymer material of the present invention exhibits semi-conductive properties and has a luminescence maximum in a spectrum region in the range of about 540 nm to about 585 nm with a half-width of the luminescence band in the range of about 55 nm to about 75 nm, a quantum yield of photoluminescence in the range of about 0.6 to about 0.8, and an electric conductivity at a temperature of about 20° C. in the range of about $1 \times 10^{-10}$ S/cm to about $5 \times 10^{-10}$ S/cm. The resultant polymer layer has a thickness in the range of about 0.01 μm to about 10 μm on a substrate placed between or on any of the electrodes. The starting pyrromethene complex may be a 1,3,5,7,8-pentamethyl-2,6-diethylpyrromethene difluoroborate complex (pyrromethene 567). Additionally, the luminescent polymer material may be formed as a layer on a substrate having conductive coating, such as a metal, a dielectric material or semi-conductive material, for example.

8 Claims, 3 Drawing Sheets

US 7,452,614 B2

LUMINESCENT SEMI-CONDUCTIVE POLYMER MATERIAL, METHOD OF PREPARING THE SAME AND ORGANIC LIGHT EMITTING ELEMENT HAVING THE SAME

CROSS-REFERENCE TO RELATED APPLICATIONS

The present application claims priority to Russian Patent Application No. 2004107865, filed on Mar. 17, 2004, the disclosure of which is hereby incorporated herein by reference in its entirety.

FIELD OF THE INVENTION

The present invention is related to light emitting materials that may be used to manufacture light emitting instruments and devices capable of emitting light through photo or electric excitation. In particular, the invention is related to a luminescent semi-conductive material based on a pyrromethene complex. Specifically, the luminescent semi-conductive material of the present invention is obtained by glow discharge polymerization. Additionally, the present invention is related to a method of preparing the luminescent semi-conductive material based on a pyrromethene complex and to an organic light emitting display (OLED) apparatus using the same.

BACKGROUND

Electroluminescent materials based on bis-(2-oxybenzyliden-4-tert-buthyl aniline) zinc and on a luminescent additive, such as "Nile Red" dye, present in an amount in the range about 0.1 wt % to about 5 wt. % are disclosed in Russian Patent No. RU 2,155,204. These materials emit in the red spectrum area (about 632 nm). There are several disadvantages associated with these materials, such as a lack of mechanical strength. This occurs because the Application material is a mixture of two low molecular weight substances.

Additionally, luminescent materials capable of electroluminescence consisting of an organic semi-conductive component and a luminophore are disclosed in Japan Patent No. JP 9082473 and European Patent Application publication No. EP 0669387. The disadvantages of these materials include that the main emission bands are caused by the luminophore and there are undesirable bands caused by the semi-conductive component in the luminescence spectra.

Furthermore, luminescent organo-siloxane polymer materials and methods for fabricating the materials are disclosed in U.S. Pat. No. 6,361,885. Here, the main chain of the polymer contains a covalently bounded organic component which is capable of luminescence and which consists of two or more condensed aromatic rings containing substituents. The light emitting polymer may be produced by re-distillation of 9,10-bis(3-trichlorosilylpropyl)anthracene synthesized by a multi-step method on a glass substrate at a high temperature and at a residual pressure of about $10^{-6}$ Torr. Then, the re-distilled layer is maintained in air for 15 minutes and then is heat-treated at about 110° C. for about 30 minutes. The resultant polymer possesses a weak pale-violet luminescent emission in a spectrum region of about 370 nm to about 430 nm. The complex multi-step production method of the starting monomer and the polymer as well as low emission intensity are major disadvantages of these polymer materials.

Also known are luminescent polymer materials containing repeated arylene-vinylene fragments and fluorinated tetraphenyl fragments. These materials are generated by the copolymerization of the fluorinated tetraphenyl derivative with a dialdehyde containing two arylene groups as disclosed in U.S. Pat. No. 6,495,273. Here, the fluorinated tetraphenylene derivative is obtained from 1,22-bis(bromomethyl)-8, 9,11,12,14,15,17,18-octafluorotetraphenyl in the presence of triphenyl phosphine. The light emitting polymer material is obtained by reaction of the monomer with arylenealdehyde where the arylene groups may include thiophene, phenyl, and carbazole, for example. Thin films for electoluminesence are produced from a solution using the spin-coating technique. The emission spectrum region of the material is about 250 nm to about 490 nm. The disadvantages associated with these materials are that the starting compounds are not easily available and additional steps are required to remove traces of solvent and catalyst.

Light emitting materials based on derivatives of diketopyrrolo-(3,4-c)-pyrrole containing a pyrromethene complex are disclosed in U.S. Patent Application Publication No. 2003/0082406 A1. In this case, the diketoptyrrolo-(3,4-c)-pyrrole derivatives used include different alkyl substituents having a number of carbon atoms in the range of about 1 to about 25, and where the derivatives are not polymers. The pyrromethene complex is added to the diketopyrrolo-(3,4-c)-pyrrole derivative in an amount of about 0.1 wt. % to about 1 wt. %. The luminescence of the resultant material is in a yellow-red region (about 580 nm to about 720 nm). A disadvantage of these luminescent materials is that the diketopyrrolo-(3,4-c)-pyrrole derivatives are not easily available. Additionally, due to low molecular weight, the organic material does not provide good mechanical strength in the form of a luminescent layer.

A method of preparing a material based on 3-hydroxyflavone, where the emission region is about 375 nm to about 475 nm, by high frequency magnetron sputtering from the surface of aluminum target in the flow of a gas-carrier which is a mixture of about 95% Ar and about 5% $O_2$ is known. This method is performed in the following manner. A high-power high-frequency discharge (about 13.56 MHz or about 600 W) in a reaction chamber is evacuated to about $10^{-5}$ Pa by placing the 3-hydroxyflavone powder on the target for magnetron sputtering. The power used during sputtering of the dye is not less than about 10 W to about 30 W. The use of such large power, however, causes partial destruction of 3-hydroxyflavone as can be seen from the gas phase mass-spectrums. The disadvantages of this method are that the resultant luminescent material is unstable during storage and a deterioration of the emission characteristics occurs after maintaining the material in air for several hours. Additionally, the light emitting material changes appearance from an initially smooth and uniform film to a spongy and powder-like film. Also, further disadvantages include a large energy consumption and high working frequency (about 13.56 MHz) which, when used in a commercial scale equipment, requires the use of special safety means for protection of the personnel. The other drawback is that the method requires the use of a special gas-carrier (argon).

SUMMARY OF THE INVENTION

The present invention is directed to a luminescent polymer material in the form of a thin, mechanically strong polymer layer. The luminescent material of the present invention has a high intensity emission in the yellow-green spectrum region and possesses an electric conductivity that is required for electroluminescence. In addition, the present invention is also directed to a luminescent polymer material based on a commercially available luminophore compound. Furthermore, the present invention is also directed a method to produce a luminescent polymer material possessing an electrical conductivity sufficient for electroluminescence from a commercially available starting luminophore compound without any substantial change in luminescence characteristics The present invention is also directed to an organic light emitting display (OLED) apparatus comprising the luminescent polymer material of the present invention.

An aspect of the present invention contemplates a luminescent material based on a pyrromethene complex. The luminescent material may comprise semi-conductive properties. The luminescent material may be formed by polymerization of the pyrromethene complex in a glow discharge. The resultant luminescent material may form the polymer layer on a substrate, which may be placed between or on any electrodes.

In a specific aspect, the pyrromethene complex may be a 1,3,5,7,8-pentamethyl-2,6-diethylpyrromethene difluoroborate complex (pyrromethene 567). The luminescence maximum of the material may be in the yellow-green spectrum region in the range of about 540 nm to about 585 nm, where the band half-width is in the range of about 55 nm to about 75 nm, and the quantum yield of photoluminescence is in the range of about 0.6 to about 0.8. The resultant luminescent material may be a polymer layer having a thickness in the range of about 0.01 µm to about 10 µm and has an electric conductivity at a temperature of about 20° C. in the range of about $1 \times 10^{-10}$ S/cm to about $5 \times 10^{-10}$ S/cm. The polymerization by glow discharge may be performed at a temperature in the range of about 250° C. to about 350° C., at a residual pressure in the range of about $10^{-1}$ Pa to about $10^{-2}$ Pa, at a discharge power in the range of about 0.5 W to about 3 W, and for a duration time in the range of about 2 minutes to about 120 minutes. The luminescent material may be deposited onto a substrate by the glow discharge. In a particular aspect, the substrate may be, for example, a metal, a dielectric material, or a semi-conductive material having a conductive coating.

The semi-conductive luminescent material of the present invention may be prepared in the following manner. Vapors of a pyrromethene complex may be polymerized by glow discharge to form a polymer layer on a substrate placed between or on any one of the electrodes. In particular, the luminescent material of the present invention may be obtained by polymerization of the 1,3,5,7,8-pentamethyl-2,6-diethylpyrromethene difluoroborate complex (pyrromethene 567) by glow discharge at a temperature in the range of about 250° C. to about 350° C., at a pressure in the range of about $10^{-1}$ Pa to about $10^{-2}$ Pa, and at a discharge power in the range of about 0.5 W to about 3 W. The resultant product may be deposited onto the substrate and then may be placed between electrodes or on any one of the electrodes. The material may exhibit luminescence in the yellow-green spectrum region with a maximum in the spectrum region in the range of about 540 nm to about 585 nm, with a band half-width in the range of about 55 nm to about 75 nm, and a quantum yield of photoluminescence in the range of about 0.6 to about 0.8. In a specific aspect, the polymer layer may have a thickness in the range of about 0.01 m to $10^{-10}$ m. The thickness of the layer depends upon the duration of the polymerization by glow discharge, which may comprise a time period in the range of about 2 minutes to about 120 minutes. The polymer may have an electric conductivity in the range of about $1 \times 10^{-10}$ S/cm to about $5 \times 10^{-10}$ S/cm at room temperature.

In a further aspect, a method of preparing a luminescent polymer material may comprise polymerizing vapors of a pyrromethene complex at a decreased pressure by glow discharge at a temperature which provides sufficient vapor pressure for a time period sufficient to form a polymer layer of a predetermined thickness on a substrate placed between or on any of the electrodes at any combinations of polymerization process parameters. In a specific aspect, 1,3,5,7,8-pentamethyl-2,6-diethylpyrromethene difluoroborate complex (pyrromethene 567) may be used as the pyrromethene complex. The polymerization process may be performed at a temperature in the range of about 250° C. to about 350° C., at a residual pressure in the range of about $10^{-1}$ Pa to about $10^{-2}$ Pa, at a discharge power in the range of about 0.5 W to about 3 W, and for a time period in the range of about 2 minutes to about 120 minutes. The substrate may be a metal, a dielectric material, or semi-conductive material having a conductive coating, for example.

In another aspect of the present invention, an organic light emitting display apparatus may comprise a glass substrate, an anode, a light emitting layer, a cathode and a protecting layer. The anode may be arranged on the glass substrate. The light emitting layer comprising a luminescent material based on a pyrromethane complex may be arranged on the anode. The luminescent material may comprise semi-conductive properties. The luminescent material may be formed by polymerization of the pyrromethene complex by glow discharge. The cathode may be arranged on the light emitting layer. The protecting layer may be arranged on the cathode to protect the cathode and the light emitting layer.

In a further aspect, the luminescent material of the present invention may be used for manufacturing a light emitting film. In particular, a display apparatus such as an organic light emitting element (OLED), a backlight assembly for a liquid crystal display (LCD) apparatus, for example, may include the luminescent polymer as a light emitting layer.

The polymer material of the present invention is capable of luminescence because polymerization by glow discharge occurs at low discharge power values which do not cause any substantial changes in the chemical structure of the molecule of 1,3,5,7,8-pentamethyl-2,6-diethylpyrromethene difluoroborate complex (pyrromethene 567).

DETAILED DESCRIPTION OF THE INVENTION

Figure 1:
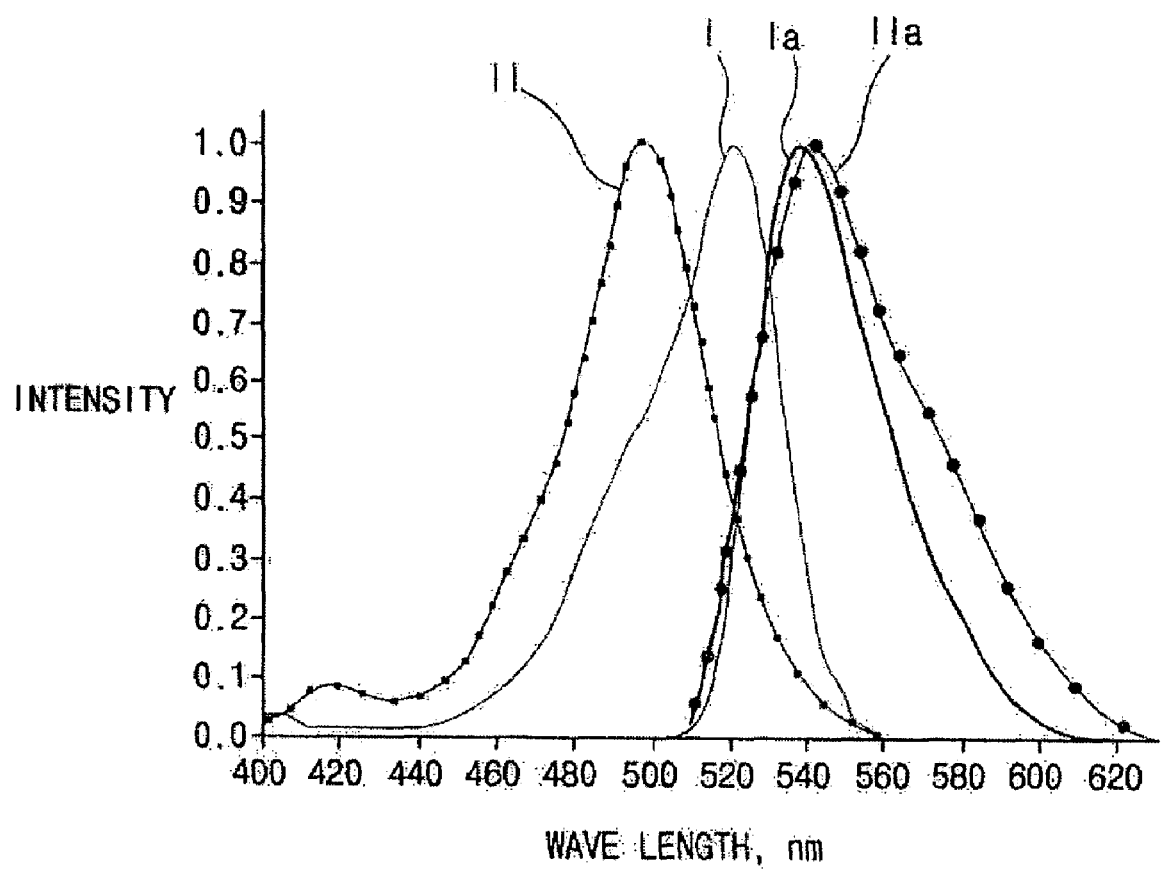
FIG. 1 is a graph illustrating the absorption spectrum and the luminescence spectrum of the starting substance, 1,3,5,7,8-pentamethyl-2,6-diethylpyrromethene difluoroborate complex (pyrromethene 567) dissolved in ethanol, and the absorption spectrum and the luminescence spectrum of the luminescent polymer of the present invention.

Referring to FIG. 1, which illustrates an embodiment of the present invention, the resultant polymer has a luminescence spectrum (curve 11a) similar to the luminescence spectrum (curve 1a) of a molecular solution of the starting compound, 1,3,5,7,8-pentamethyl-2,6-diethylpyrromethene difluoroborate complex (pyrromethene 567). Maximums of the luminescence bands for the starting compound and for the polymer material based on the starting material correspond to each other and are in a range of about 540 nm and about 542 nm. A half-width of the luminescence band is in the range of about 55 nm to about 60 nm. An absorption spectrum (curve II) of the polymer material based on 1,3,5,7,8-pentamethyl-2,6-diethylpyrromethene difluoroborate complex displays a little shift to shorter wavelengths relative to an absorption spectrum (curve I) for the solution of the starting substance in ethanol (maximums are at about 500 nm and about 520 nm, respectively). The chemical structure of the starting compound and the configuration of its energy levels are maintained in an elementary moiety of the produced polymer material. The starting 1,3,5,7,8-pentamethyl-2,6-diethylpyrromethene difluoroborate complex (pyrromethene 567) has a crystalline structure and is soluble in organic solvents such as ethanol and chloroform, for example. A morphological structure of the light emitting polymer of the present invention substantially differs from that of the starting substance, which is confirmed by the absence of a crystalline phase in samples of the polymer as shown by polarized light optic microscopy. The resultant polymer is not soluble in organic solvents, such as ethanol and chloroform, for example.

Figure 2:
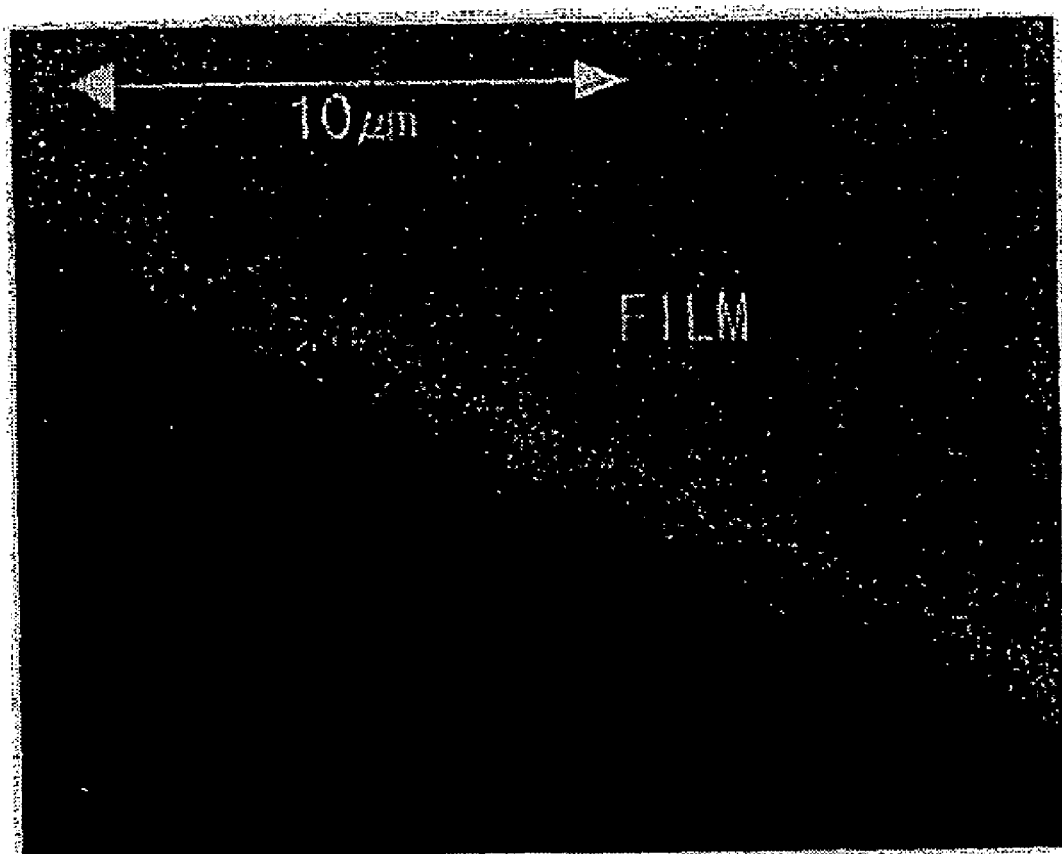
FIG. 2 is a cross-sectional image showing the luminescent polymer arranged on a substrate made of quartz glass (fused silica) in accordance with an embodiment of the present invention.

Referring to FIG. 2, which illustrates an embodiment of the present invention, the polymer of the present invention forms a continuous and uniform layer and adheres strongly to the substrate (i.e., passes the scotch-test). This data indicates that the luminescent polymer material of the present invention retains the functional structural elements responsible for the luminescence properties. Additionally, the resultant luminescent polymer material exhibits semi-conductive properties, such as electric conductivity in the range of about $1 \times 10^{-10}$ S/cm to about $5 \times 10^{-10}$ S/cm.

In an embodiment, the luminescent polymer material may be generated by polymerization by glow discharge in an apparatus as disclosed in Russian Patent No. RU 2205838, for example. Here, a reaction chamber of the apparatus may be equipped with two plane-parallel electrodes. A cup with the starting substance may be placed onto one of the electrodes. An upper part of the reaction chamber may be placed into an electric furnace that heats the reaction chamber to a required temperature controlled by a Chromel-Copel thermocouple. Before the polymerization process and deposition of the polymer layer onto the substrate place between the electrodes or on any one of the electrodes, the reaction chamber is first evacuated to the residual pressure of no more than about $10^{-3}$ Pa. Then, the chamber may be heated to the desired temperature, a voltage of the glow discharge may be applied to the electrodes and the polymerization by glow discharge may be performed.

EXAMPLES

Specific Example 1

The polymerization of 1,3,5,7,8-pentamethyl-2,6-diethylpyrromethene difluoroborate complex (pyrromethene 567) was carried out by glow discharge at a temperature of about 250° C., at the discharge power of 0.5 W and a residual pressure of about $10^{-2}$ Pa for about 2 minutes. A polymer layer was deposited onto a substrate made of quartz glass having a conductive coating and then deposited onto one of the electrodes. The resultant layer had a thickness of about 0.01 μm, an electrical conductivity of about $1 \times 10^{-10}$ S/cm, a luminescence maximum in a spectrum region in the range of about 540 nm to about 544 m with a half-width of the luminescence band in the range of about 55 nm to about 60 nm, and a quantum yield of photoluminescence of about 0.8.

Specific Example 2

A luminescent polymer material layer was prepared similar to Example 1, but using the following conditions. The polymerization was conducted at the temperature of about 350° C., the discharge power was about 3 W, the residual pressure was about $10^{-1}$ Pa and the duration time was about 120 minutes. The resultant layer was deposited on a silicon substrate placed on one of the electrodes and had a thickness of about 10 μm, an electric conductivity of about $5 \times 10^{-10}$ S/cm, a luminescence maximum in a spectrum region in the range of about 575 nm to about 585 nm with a half-width of the luminescence band in the range of about 65 nm to about 75 nm, and quantum yield of photoluminescence of about 0.6.

Specific Example 3

A luminescent polymer material layer was prepared as in Example 1, but using the following conditions. The polymerization was carried out at a temperature of about 300° C., at a discharge power of about 1.5 W, at a residual pressure of about $5 \times 10^{-2}$ Pa and with a duration time of polymerization of about 60 minutes. The resultant layer was deposited on metal substrate placed between the electrodes and had a thickness of about 5 μm, an electric conductivity of about $2 \times 10^{-10}$ S/cm, a luminescence maximum in a spectrum region in the range of about 560 nm to about 570 nm with a half-width of the luminescence band in the range of about 60 nm to about 65 nm, and a quantum yield of photo-luminescence of about 0.68.

Organic Light Emitting Display (OLED) Apparatus

Figure 3:
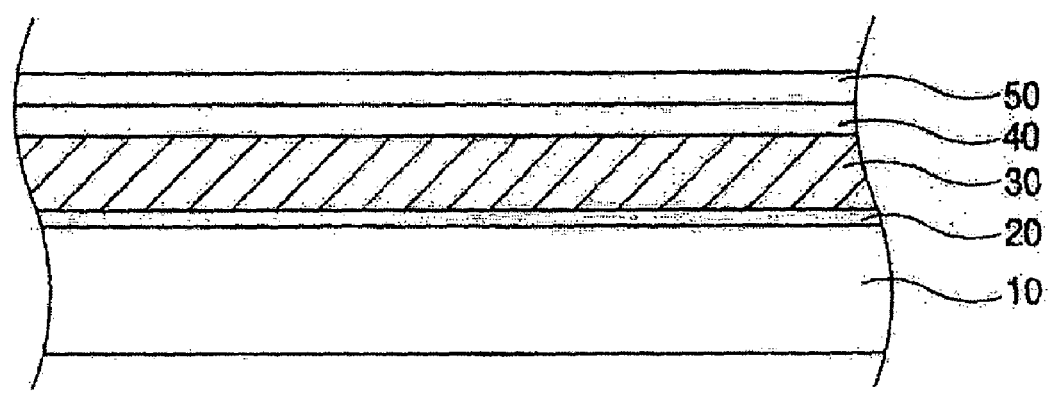
FIG. 3 is a cross-sectional view illustrating an organic light emitting display (OLED) apparatus in accordance with an embodiment of the present invention.

Referring to FIG. 3, which illustrates an embodiment of the present invention, the OLED apparatus comprises a glass substrate 10, an anode 20, a light emitting layer 30, a cathode 40 and a protecting layer 50. The anode 20 may be arranged on the glass substrate 10, and may be a metal. A first voltage may be applied to the anode 20 through a driving thin film transistor (not shown) and a switching thin film transistor (not shown). The light emitting layer 30 may be arranged on the anode 20. The light emitting layer 30 may comprise a luminescent polymer material based on 1,3,5,7,8-pentamethyl-2,6-diethylpyrromethene difluoroborate complex (pyrromethene 567).

The cathode 40 may be arranged on the light emitting layer 30. The cathode 40 may be fabricated from a transparent conductive material such as indium tin oxide (ITO), tin oxide (TO), indium zinc oxide (IZO), and zinc oxide (ZO), for example. A second voltage may be applied to the cathode 40. Alternatively, a buffer layer (not shown) may be arranged between the light emitting layer 30 and the cathode 40. When the first and second voltages are applied to the anode 20 and the cathode 40, a current flows through the light emitting layer 30 to generate a light. The protecting layer 50 may be arranged on the cathode 40 to protect the cathode 40 and the light emitting layer 30 from an impurity and an impact that are provided from an exterior to the OLED apparatus.

According to embodiments of the present invention, a new luminescent polymer material based on 1,3,5,7,8-pentamethyl-2,6-diethylpyrromethene difluoroborate complex (pyrromethene 567) is provided. The luminescent polymer material has a luminescence maximum in the spectrum region in the range of about 540 nm to about 585 nm with the half-width of the luminescence band in the range about 55 nm to about 75 nm, a quantum yield of photoluminescence in the range of about 0.6 to about 0.8, and an electric conductivity in the range of about $1 \times 10^{-10}$ S/cm to about $5 \times 10^{-10}$ S/cm. The luminescent polymer material of the present invention may be used to design a new light emitting film. The luminescent polymer material of the present invention based on 1,3,5,7,8-pentametyl-2,6-diethylpyrromethene difluoroborate complex (pyrromethene 567) may be generated by polymerization by glow discharge. As a result, the polymer may be deposited on the substrate as a thin layer.

The methodology of the present invention is advantageous because it is simple to perform. The method is based on the use of a commercially available luminophore and does not require the use of solvent in order to obtain thin layers of the luminescent semi-conductive polymer material for designing the new light emitting films.

What is claimed is:

1. A device, comprising:
a luminescent material based on a pyrromethene complex exhibiting semi-conductive properties, wherein the luminescent material is generated by polymerization of the pyrromethene complex in a glow discharge, and wherein a polymer layer comprising the luminescent material is arranged on a substrate between or on any electrode, and the pyrromethene complex is 1,3,5,7,8-pentamethyl-2,6-diethylpyrromethene difluoroborate (pyrromethene 567).

2. The device of claim 1, wherein the luminescent material has a luminescence maximum in a spectrum region in the range of about 540 nm to about 585 nm, a band half-width in the range of about 55 nm to about 75 nm and a photoluminescence quantum yield in the range of about 0.6 to about 0.8.

3. The device of claim 1, wherein the polymer layer has a thickness in the range of about 0.01 μm to about 10 μm.

4. The device of claim 1, wherein the polymer layer has an electric conductivity in the range of about $1 \times 10^{-10}$ S/cm to about $5 \times 10^{-10}$ S/cm at a temperature of about 20° C.

5. The device of claim 1, wherein the pyrromethene complex is polymerized in the glow discharge at a temperature in the range of about 250° C. to about 350° C., a residual pressure in the range of about $10^{-1}$ to about $10^{-2}$ Pa, a discharge power in the range of about 0.5 W to about 3 W, and a duration time in the range of about 2 minutes to about 120 minutes.

6. The device of claim 1, wherein the substrate is fabricated from a material selected from the group consisting of a metal, a dielectric material, and a semi-conductive material having a conductive coating.

7. The device of claim 1, wherein the polymer layer is a light emitting film.

8. A organic light emitting display apparatus comprising:
a glass substrate;
an anode arranged on the glass substrate;
a light emitting layer arranged on the anode, wherein the light emitting layer comprises a luminescent material based on a pyrromethene complex having semi-conductive properties, wherein the luminescent material is generated by polymerization of the pyrromethene complex in a glow discharge and the pyrromethene complex is 1,3,5,7,8-pentamethyl-2,6-diethylpyrromethene difluoroborate (pyrromethene 567);
a cathode arranged on the light emitting layer; and
a protecting layer arranged on the cathode to protect the cathode and the light emitting layer.

* * * * *

UNITED STATES PATENT AND TRADEMARK OFFICE
CERTIFICATE OF CORRECTION

| | | |
|---|---|---|
| PATENT NO. | : 7,452,614 B2 | Page 1 of 1 |
| APPLICATION NO. | : 11/024608 | |
| DATED | : November 18, 2008 | |
| INVENTOR(S) | : Alexander Ivanovich Drachev et al. | |

It is certified that error appears in the above-identified patent and that said Letters Patent is hereby corrected as shown below:

Title Page, Item [73] should read
--Assignee(s): Samsung Electronics Co., Ltd.
　　　　　　　 Gyeonggi-do (KR)

N.S. Enikolopov Institute of Synthetic Polymer Materials of Russian Academy of
　　　　　　　 Sciences Moscow (RU)--

Signed and Sealed this
Fourth Day of January, 2011

David J. Kappos
*Director of the United States Patent and Trademark Office*